(12) United States Patent
Nath et al.

(10) Patent No.: US 11,741,282 B2
(45) Date of Patent: Aug. 29, 2023

(54) REINFORCEMENT LEARNING-BASED ADJUSTMENT OF DIGITAL CIRCUITS

(71) Applicant: Synopsys, Inc., Mountain View, CA (US)

(72) Inventors: Siddhartha Nath, San Jose, CA (US); Vishal Khandelwal, Portland, OR (US); Yi-Chen Lu, Atlanta, GA (US); Praveen Ghanta, Palo Alto, CA (US)

(73) Assignee: Synopsys, Inc., Sunnyvale, CA (US)

( * ) Notice: Subject to any disclaimer, the term of this patent is extended or adjusted under 35 U.S.C. 154(b) by 4 days.

(21) Appl. No.: 17/579,490

(22) Filed: Jan. 19, 2022

(65) Prior Publication Data

US 2022/0229960 A1 Jul. 21, 2022

Related U.S. Application Data

(60) Provisional application No. 63/139,600, filed on Jan. 20, 2021.

(51) Int. Cl.
*G06F 30/3315* (2020.01)
*G06F 30/27* (2020.01)

(52) U.S. Cl.
CPC .......... *G06F 30/3315* (2020.01); *G06F 30/27* (2020.01)

(58) Field of Classification Search
USPC ........................................................ 716/110
See application file for complete search history.

(56) References Cited

U.S. PATENT DOCUMENTS

2020/0175216 A1* 6/2020 Ho ........................ G06F 30/394

* cited by examiner

*Primary Examiner* — Bryce M Aisaka
(74) *Attorney, Agent, or Firm* — Patterson + Sheridan, LLP

(57) ABSTRACT

Systems and methods for adjusting a digital circuit design are described. For example, the method may include selecting a first path in the digital circuit design. The first path includes a plurality of gates. The method also includes generating a k-hop neighborhood graph of the first path, encoding the k-hop neighborhood graph into a state vector, and applying a machine learning model to the state vector to determine an adjustment to be made on a first gate of the plurality of gates. The method further includes changing the first gate based on the adjustment.

20 Claims, 9 Drawing Sheets

REINFORCEMENT LEARNING-BASED ADJUSTMENT OF DIGITAL CIRCUITS

CROSS-REFERENCE TO RELATED APPLICATIONS

This application claims priority to and the benefit of U.S. Provisional Patent Application Ser. No. 63/139,600, entitled "Reinforcement Learning-Based Optimization of Digital Circuits," filed Jan. 20, 2021, which is incorporated herein by reference in its entirety.

TECHNICAL FIELD

The present disclosure generally relates to an electronic design automation (EDA) system. In particular, the present disclosure relates to a system and method for providing reinforcement learning-based optimization of digital circuits.

BACKGROUND

In digital implementation flows, the improved power, performance, and area (PPA) is achieved by adjusting the netlist through logic-adjustment, placement and physical adjustment, clock-tree adjustment, and routing and post-route adjustment. Some of these are global adjustment methods (such as global placement and routing), while many others are local adjustment techniques. The typical approach is to employ global and more aggressive local adjustment methods early in the flow, where the designs have more flexibility and need to converge to a good state, and then transition to more targeted/convergent techniques later in the flow.

Netlist adjustment, however, is a non-deterministic polynomial-time-hard (NP-hard) combinatorial adjustment problem. For each adjustment on an instance, there is an exponential number of possible solutions that may be evaluated. This makes the global solution space exponentially large with respect to adjustments, such as sequential remapping, logic restructuring, layer assignment, etc.

As an example, gate sizing is an adjustment that pervades through all stages of netlist adjustment from synthesis to post-route. Gate sizing refers to changing the drive strength (logical effort) of a gate by either choosing another equivalent size from the technology library with a different width, channel length, body biasing, threshold voltage, or other transistor characteristics. In the context of electronic design automation (EDA), these details can be broadly classified as upsizing (e.g., improving drive strength or reducing gate delay), downsizing (e.g., degrading drive strength or increasing gate delay), or leaving the current size unchanged. On netlists with over a million gates (or instances) adjusting for the appropriate size of the gate given all the options from the technology library is a combinatorial problem.

Despite this exponentially large global solution space, the need for best-in-class PPA leads to EDA developers deploying many heuristics for gate sizing to keep runtime linear. These heuristics can lead to the process getting stuck at local optima of PPA quality of results (QoR). For example, transforms used on both clock and data path adjustments are gate sizing, (re-) buffering, logic restructuring, sequential adjustments (e.g., remapping, multibit etc.), clock-tree skewing, local placement and routing tricks, including mega-transforms that combine some of these atomic transforms. The solution space is very large and digital implementation systems are expected to deliver the best PPA in the shortest turn-around-time (TAT).

SUMMARY

According to an embodiment, a method of adjusting a digital circuit design includes selecting a first path in the digital circuit design. The first path includes a plurality of gates. The method also includes generating a k-hop neighborhood graph of the first path, encoding the k-hop neighborhood graph into a state vector, and applying a machine learning model to the state vector to determine an adjustment to be made on a first gate of the plurality of gates. The method further includes changing the first gate based on the adjustment.

The method may include performing a static timing analysis on the digital circuit design after changing the first gate and updating the machine learning model based on results of the static timing analysis.

Selecting the first path may include performing a static timing analysis to identify a plurality of paths. Selecting the first path may also include selecting the first path from the plurality of paths based on a slack of the first path.

The method further may include applying the machine learning model to determine a second adjustment on the first gate if an objective function does not converge.

The method may include applying the machine learning model to determine a second adjustment on a second gate of a second path in the digital circuit design after changing the first gate.

The adjustment may be to one or more of gate sizing, buffering, logic restructuring, sequencing, clock-tree skewing, placement, and routing.

According to another embodiment, an apparatus for adjusting a digital circuit design includes a memory and a hardware processor communicatively coupled to the memory. The hardware processor generates a k-hop neighborhood graph for a first gate in the digital circuit design. The k-hop neighborhood graph includes a plurality of nodes representing a plurality of neighbors of the first gate in the digital circuit design. The hardware processor also encodes the k-hop neighborhood graph into a state vector that includes a numerical representation of the first gate and the plurality of neighbors, applies a machine learning model to the state vector to determine, based on a graph neural network, an adjustment to be made to the first gate, and changes the first gate based on the adjustment.

The hardware processor may perform a static timing analysis on the digital circuit design after changing the first gate and update the machine learning model based on results of the static timing analysis.

The hardware processor may select a path that includes the first gate by performing a static timing analysis to identify the path. Selecting the first path may also include selecting the path from a plurality of paths based on a slack of the path.

The hardware processor may apply the machine learning model to determine a second adjustment on the first gate if an objective function of the digital circuit design does not converge.

The hardware processor may apply the machine learning model to determine a second adjustment on a second gate in the digital circuit design after changing the first gate.

According to another embodiment, a non-transitory computer readable medium stores instructions that, when executed by a processor, cause the processor to perform an operation for adjusting a digital circuit design. The operation includes generating a plurality of k-hop neighborhood graphs for a plurality of gates in the digital circuit design and encoding the plurality of k-hop neighborhood graphs into a plurality of state vectors. The operation also includes applying a machine learning model to the plurality of state vectors to determine a plurality of adjustments to be made to the plurality of gates that improve a power, performance, and area (PPA) of the digital circuit design even though an adjustment of the plurality of adjustments worsens the PPA of the digital circuit design. The operation further includes changing the plurality of gates based on the plurality of adjustments.

The operation may include performing a static timing analysis on the digital circuit design after changing the plurality of gates and updating the machine learning model based on results of the static timing analysis.

The operation may include selecting a path that includes the plurality of gates by performing a static timing analysis to identify the path. Selecting the path may include selecting the path from a plurality of paths based on a slack of the path.

The operation may include applying the machine learning model to determine an adjustment on a gate of the plurality of gates if an objective function of the digital circuit design does not converge.

The operation may include applying the machine learning model to determine a second adjustment on a second gate in the digital circuit design after changing a first gate of the plurality of gates.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

This disclosure describes a reinforcement learning-based technique to digital circuit enhancement. A computer system (such as the computer system 900 in FIG. 9) may perform the reinforcement learning-based technique. Increasing circuit design sizes push EDA tools to maintain pseudo-linear complexity of netlist adjustment methods, thereby limiting the global exploration done by the underlying methods. Reinforcement learning (RL) provides high-quality results. The challenge with any NP-hard problem is that new innovative heuristics should be developed to improve upon the existing solution (e.g., find a better local minimum). To this end, this disclosure describes a reinforcement learning-based technique that provides better and efficient PPA convergence, in particular embodiments. Generally, the described system and process involves (1) selecting a path of a circuit design, (2) generating a state vector of the selected path, and (3) applying a machine learning model (e.g., reinforced learning) to the state vector to determine an adjustment category (e.g., gate sizing, buffering, logic restructuring, sequencing, clock-tree skewing, placement, and routing) and an adjustment within that adjustment category to be made to a gate in the path.

Given a set of physical synthesis adjustments (e.g., sizing, (re-)buffering, logic restructuring, sequential remapping, multibit, concurrent clock data, local placement, and incremental routing) for timing, power and area, the RL technique will determine the best sequence or set of adjustments on the netlist to achieve improved PPA convergence (e.g., lower power consumption with higher performance in a reduced area). In certain embodiments, using the RL technique to determine what adjustments to make to a circuit design results in the circuit design having a better PPA relative to using other, conventional techniques for determining adjustments. For example, a greedy adjustment algorithm that selects, at each iteration, the adjustments that produce the largest PPA improvement may get stuck in local minima and not make adjustments that result in better overall PPA. The RL technique, on the other hand, may evaluate adjustments based on their effect on the overall PPA. For example, the RL technique may select adjustments in an iteration that do not produce the greatest improvement to PPA in that iteration but are predicted to lead to the best overall PPA at the end of the adjustment process. As a result, the RL technique determines adjustments that improve the PPA of a circuit design relative to other techniques.

Figure 1:
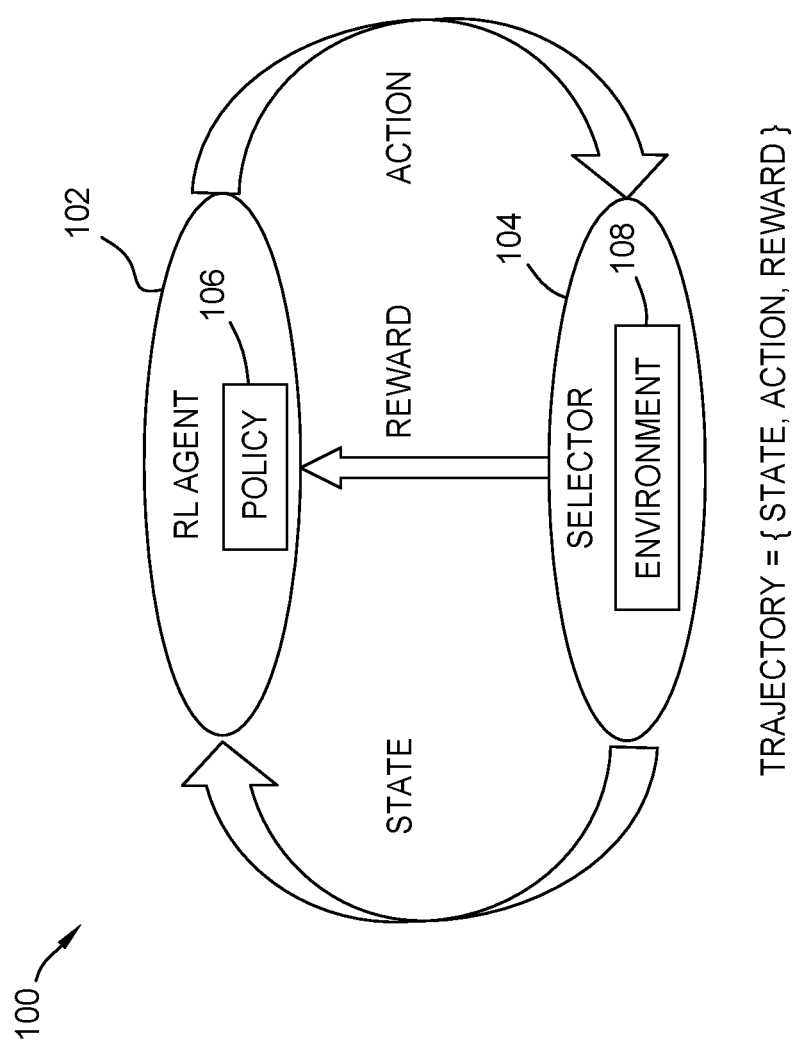
FIG. 1 illustrates an example system.

The netlist adjustment problem can be intuitively formulated as a Markov decision process (MDP), as there are many sequential decisions made iteratively regarding sizes of gates on critical (and, sometimes sub-critical) paths to achieve PPA convergence. Therefore, RL systems, such as the system 100 shown in FIG. 1, can be applied to solve this problem (e.g., maximize the reward of this process). As seen in FIG. 1, the system 100 includes an RL agent 102 and a selector 104. Generally, the system 100 uses the RL agent 102 to apply machine learning to analyze design instances in a netlist and to determine the best adjustment. The RL agent 102 does not apply a greedy policy in which the RL agent 102 always selects the adjustment that provides the best reward out of the possible options, because that may cause the RL agent 102 to get stuck in local minima. Rather, through training, the RL agent 102 may develop and apply a policy 106 (e.g., a machine learning model) to one or more design instances to select the best set of adjustments that maximizes the reward for the whole process, even if an adjustment for a particular instance does not provide the best reward out of the possible adjustment options. Additionally, adjustments that are taken in previous time steps (prior instances) will contribute to the decision of the current time step. The RL agent 102 captures this dependency to increase the total reward of the process. In some embodiments, the system 100 implements a graph neural network (GNN) of past adjustments or sequences of past adjustments. The GNN allows the system 100 (e.g., the RL agent 102) to evaluate the effects of past adjustments or sequences of past adjustments and to predict the impact of future adjustments on the PPA of a circuit design. For example, the GNN may reveal patterns or sequences of adjustments that have previously resulted in large improvements to PPA, even if specific adjustments in these patterns or sequences do not by themselves improve PPA. Based on this GNN, the system 100 may predict future adjustments consistent with these patterns or sequences, which result in increased PPA relative to other adjustment techniques. The system 100 may implement any suitable machine learning technique. For example, the system 100 may implement a decision tree to predict the impact of future adjustments based on the effects of past adjustments. The system 100 may traverse through the decision tree as adjustments are made, and the system 100 may traverse through subsequent nodes or branches in the decision tree to predict the impact or effect of a particular adjustment on overall PPA.

Given a set of design instances in a netlist, the RL agent 102 is trained to sequentially determine the best adjustments. Netlist improvement is mapped to RL shown in FIG. 1 as follows:

State (s) represents a "design instance," which is realized by concatenating the encoded features of its local graph (e.g., a K-hop neighborhood), and the technology features extracted from libraries.

Action (a) refers to the new adjustments assigned to the design instance in state (s). For example, for a sizing adjustment, it may be realized as the "driving strength change" ($\Delta d$). Assume an instance is in a gate size that has strength (d). After taking an action (a sizing adjustment), it is assigned the gate size in the technology whose strength is the closest to $d+\Delta d$ among all possible choices.

Environment represents the union of design netlist and its response upon receiving action(s) from the agent.

Reward (r) is the outcome of performing an action (a) on an instance in state (s). For example, it may represent the total negative slack (TNS) change of the instance's local-graph. For each RL iteration, the goal of the RL agent 102 is to maximize the total reward (sum of individual rewards) of all instances. An instance's reward may also be referred to as the cost. It may be a function of timing, area, and power.

Trajectory ($\zeta$) refers to an iteration (an RL process), from time step t=0 to t=T (final time step). At each time step t, there is a corresponding state (st), action (at), and reward (rt) pair denoted as (st, at, rt).

The selector 104 determines the effects that an adjustment selected by the RL agent 102 has on a design instance. The selected adjustment and the changes to the design instance caused by performing the adjustment are encapsulated in an environment 108. The selector 104 analyzes the environment 108 to determine a reward (e.g., a change to total negative slack) for the selected adjustment (e.g., a gate sizing adjustment). For example, the selector 104 may perform static timing analysis (STA) on the environment 108 to determine the reward of a selected adjustment. In one example, an adjustment may be made to the size of an inverter (e.g., from INVD2LVT to INVD4LVT), which increases the drive strength and improves the delay of the inverter. The selector 104 may determine that the reward is a change in the total negative slack or a change in a weighted sum of total negative slack, power, and area of the design. After determining the reward, the selector 104 provides the reward to the RL agent 102. As an example, when netlist changes are made to the netlist hypergraph and timing and power analyses are run, the selector 104 may determine and provide the design's worst and total negative slack and total power to the RL agent 102. The selector 104 also analyzes the environment 108 to select the next design instance (e.g., a next gate or a next path in a circuit design) for the RL agent 102 to analyze. The selector 104 then passes the next design instance to the RL agent 102, and the RL agent 102 selects the next adjustment based on the next design instance.

In some embodiments, the RL agent 102 is updated and retrained after each iteration. For example, the RL agent 102 may update the machine learning policy 106 based on the selected action and the reward indicated by the selector 104. As a result, the RL agent 102 takes into account the previous actions that were taken and the rewards of those previous actions when analyzing subsequent instances and selecting subsequent actions. In this manner, the RL agent 102 can determine relationships between and amongst the selected actions and predict subsequent actions that maximize the overall reward for the process.

The RL agent 102 uses a sequence of iterations (RL episodes) to determine the best actions for each design instance such that when the episodes terminate (e.g., timestep t=T), each instance has a final state that will eventually lead to improved PPA convergence. To make the process efficient, the reward of each instance is evaluated within its local graph's context. This also allows multiple instances that have minimal timing impact on each other's local subgraph induced by their actions. For example, if instances I1 and I2 are selected in the same iteration, then applying new adjustments to I1 does not impact or has negligible impact on the timing of instances in the local subgraph of I2, and vice versa. So, I1 and I2 can be adjusted in parallel in two threads. Such instances may be referred to as non-intersecting instances. The idea is generalized to a set of non-intersecting instances in each RL episode. By running several RL trajectories, the best adjustment(s) per instance that leads to an improvement of design QoR/PPA convergence may be selected.

In the system 100, each selected instance is considered as a unique RL state and their new adjustment is determined sequentially. Static timing analysis (STA) update is performed at the end of an iteration, which provides the RL reward for each action taken. Actions (e.g., adjustments) that are taken in previous time steps (prior instances) will contribute to the decision of the current time step. The RL agent 102 captures this dependency and increases the total reward of the process.

As a result, the system 100 determines the best sequence of adjustments for efficient PPA convergence in certain embodiments. Additionally, for each instance and adjustment, a local graph costing predictive framework accurately correlates with cost on a netlist's main graph in some embodiments. This is important because the local graph's cost may be a good proxy for the main graph's cost to achieve scalability and efficiency in the RL process. Furthermore, in some embodiments, a deep Q-network (DQN)-style critic model and deep deterministic policy gradient (DDPG)-style actor model may be used. A pre-trained model may bootstrap the critic's model. This pre-trained model accurately predicts cost change for each instance. The actor model captures an electrical property change's impact on the local context of an instance for each adjustment. This allows the RL agent 102 to make the best policy 106 per RL episode and achieve a better solution than a greedy best cost per problem-based solution.

Given a set of instances in a netlist and a set of adjustments for physical synthesis, place and route, the system 100 may include the following features: a method to select a set of best instances to adjust in an iteration (or, RL trajectory), a local graph representation of each of these instances, a pre-trained model to predict the reward from local graph given an adjustment on the instance, STA at the end of an iteration, and training and update of RL models.

Figure 2:
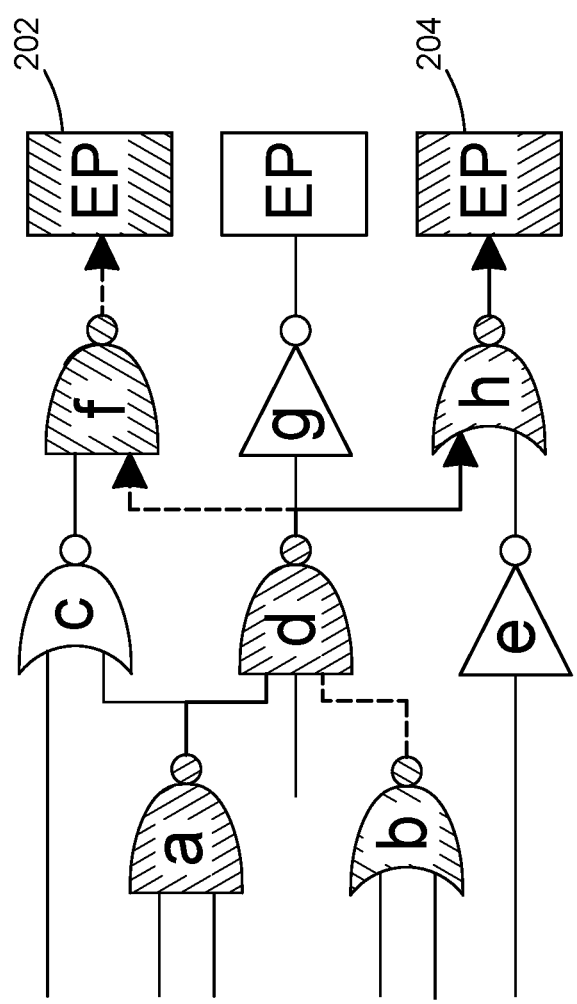
FIG. 2 illustrates an example instance selection in the system of FIG. 1.

The instance selection method depends on the type of adjustment and is determined by the system 100. For example, to minimize delay, the system 100 could choose instances from the critical (and, sub-critical) paths to an endpoint in a multi-corner multi-mode (MCMM)-aware manner. FIG. 2 illustrates an example instance selection in the system 100 of FIG. 1. In the example of FIG. 2, the paths to the endpoints (EPs) 202 and 204 at the top right and the bottom right, respectively, have been selected (e.g., by the selector 104). The first path to the bottom right endpoint 204 includes the gates a, d, and h. The second path to the top right endpoint 202 includes the gates b, d, and f.

First, a full-chip timing analysis (STA) is run (Line 1 of method 1 below) and then paths are traversed based upon their criticality (for example, or any other heuristic) (Lines 2-3 of method 1 below). Next, the system 100 traverses instances on the critical path and adds them to a set V' if these do not exist in V' and the K-hop local graphs of the traversed instances on the critical path do not overlap with that of the instances already in V' (Lines 4-8 of method 1 below). As a result, the algorithm may work on an adjustment in a local graph (e.g., adjust sizing on an instance in the local graph). To ensure that the reward calculations per local graph are accurate, the system 100 may make sure that the instances on the boundary of the local graph do not overlap with other local graphs, which ensures that costs like timing are relatively isolated to within the local graph and adjustments in different local graphs do not affect each other.

The instances in V' are sorted (e.g., topologically sorted) and picked up for adjustment (Line 9 of method 1 below). This allows a batch of instances to be processed based on their sorting order. For example, if there are 10K instances and only 32 cores are available, the first 32 are scheduled for adjustment, followed by the next 32, etc. based on the topological ordering. Topological sorting may ensure that the impact of an adjustment is at a maximum at a root node rather than a leaf node. Other sorting heuristics may be used (e.g., sorting based on drive strength, output transition times, input capacitance, etc.). One criterion for the sorting heuristic may be that all the selected instances are independent of each other.

Once the system 100 selects a set of instances to adjust based on method 1 (shown below), these instances are marked as visited, so that when method 1 is invoked again for a subsequent RL iteration, instances on critical paths that have not been visited are selected. Instances could be selected based on critical path or any other heuristic (e.g., instances on critical path with the worst transition time or instances on non-violating paths in an even-odd fashion, etc.). Once all instances in a critical path have been visited, a flag is unset so that subsequent RL iterations can work on these instances again.

Method 1 Instance selection for an RL iteration (RL trajectory).

Figure 3:
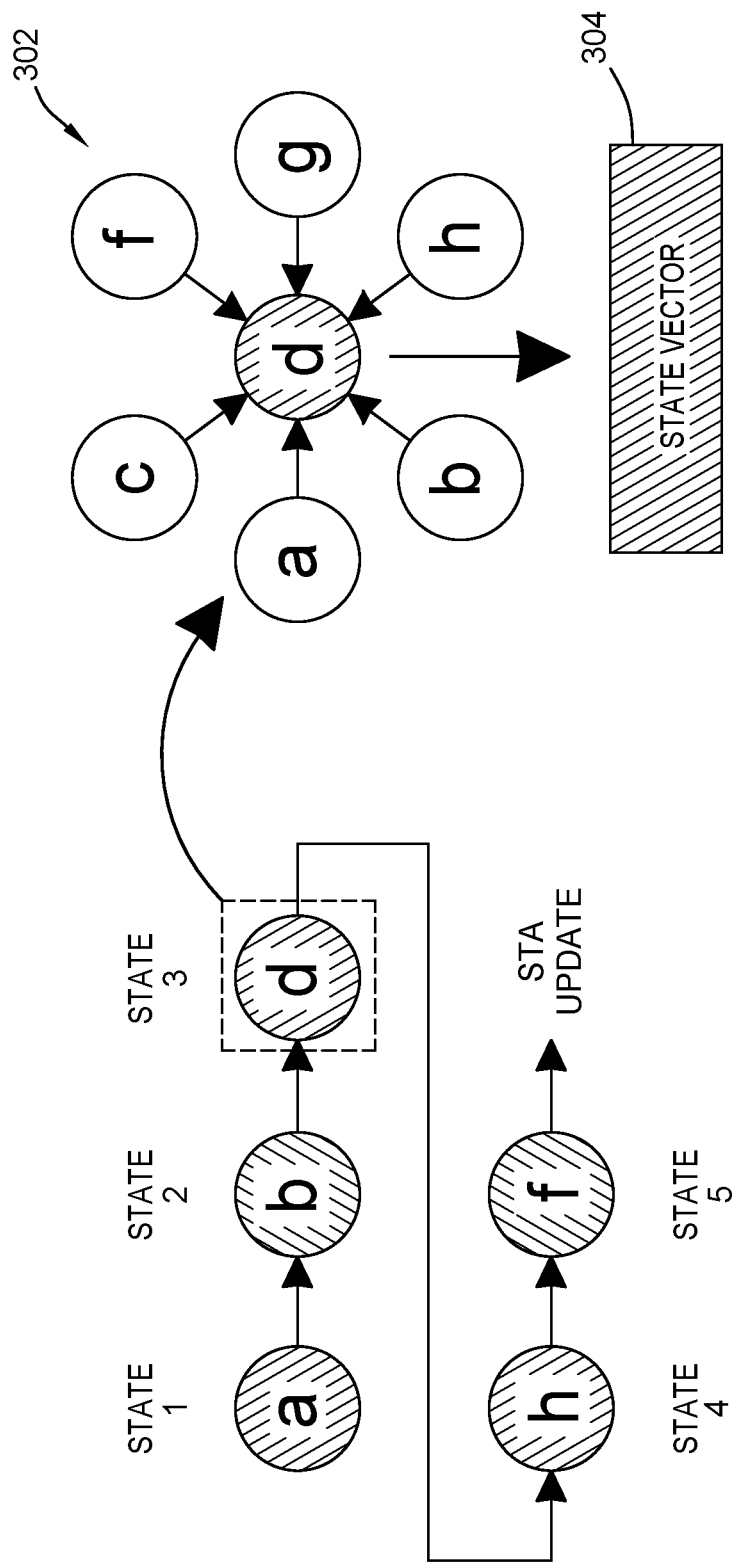
FIG. 3 illustrates an example reinforced learning trajectory and local graph encoding in the system of FIG. 1.

Input: G(V, E): a post-route netlist.
Output: V' ∈ V: selected instances to be adjusted.
1:    V' ← { }; Run full-chip STA.
2:    W ← current worst negative slack (WNS) path or any other heuristic
3:    {P} ← current negative slack paths
4:    for p ∈ {P} do
5:    |    if p is overlapping with W then
6:    |    |    for v ∈ p do
7:    |    |    |    if Non-overlapping local-graphs of v, i ∈ {V'} then
8:    |    |    |    |    add instance v on path p to set V'
9:    V' ← topological_sort(V') ▷ linear time, achieved by DFS Method 1: Instance Selection Method for an RL Iteration FIG. 3 illustrates an example reinforced learning trajectory and local graph encoding in the system of FIG. 1. As seen in FIG. 3, the instance for gate d is selected for adjustment. The RL agent 102 (shown in FIG. 1) constructs a k-hop neighborhood graph 302 for the gate d. The graph 302 includes the immediate neighbors of gate d (e.g., a 1-hop graph), which include gates a, b, c, f, g, and h. The RL agent 102 then generates a state vector 304, which may be a numerical representation of the graph 302.

The RL agent 102 then analyzes the state vector 304 to select an adjustment for gate d that the RL agent 102 predicts will increase the overall reward of the process. By analyzing the state vector 304 that represents the characteristics of the gate d and its immediate neighbors, the RL agent 102 takes into account the behavior of gate d and the behavior of the neighbors of gate d when selecting the adjustment for gate d. For example, the state vector 304 may be a d-dimensional vector of real numbers that embed aggregated neighboring instance features along with the current instance's features. Some examples of features are listed in Table 1, below. These features are aggregated for instance 'd' and its neighbors (a, b, c, e, f, g), transformed, appended with technology features like nominal RC delay to form the state vector 304. The state vector 304 can be of any suitable dimension (e.g., 64, 128, 256, or larger). An adjustment at instance 'd' may be to size it to INVD6LVT (if is an inverter) and a reward could be change in total negative slack (e.g., from −50 ns to −48 ns, a 2 ns improvement).

Given an instance, a local-graph of this instance (e.g., a K-hop neighborhood graph 302) can be constructed from the netlist. The rationale is two-fold. First, the adjustment for the instance not only depends on the characteristics of itself, but also the behavior of its neighbors (e.g. the capacitive load that this target instance is driving). Such characteristics may be efficiently modeled using a GNN that encodes neighborhood information into a vector as an RL state vector (e.g., the state vector 304), which serves as the input of the RL agent 102 for the decision of the corresponding RL action (e.g., new adjustment). Second, the timing impact of an adjustment on a design instance to the overall netlist diminishes as the hop count increases. Therefore, instead of using the total design QoR change as the RL reward of an adjustment, the QoR change of its local-graph may be used. This way, the reward gives fast and good fidelity approximation, while offering an opportunity for parallel computation. An improvement in local-graph QoR mostly results in an improvement with the design's QoR, and vice versa.

Figure 4:
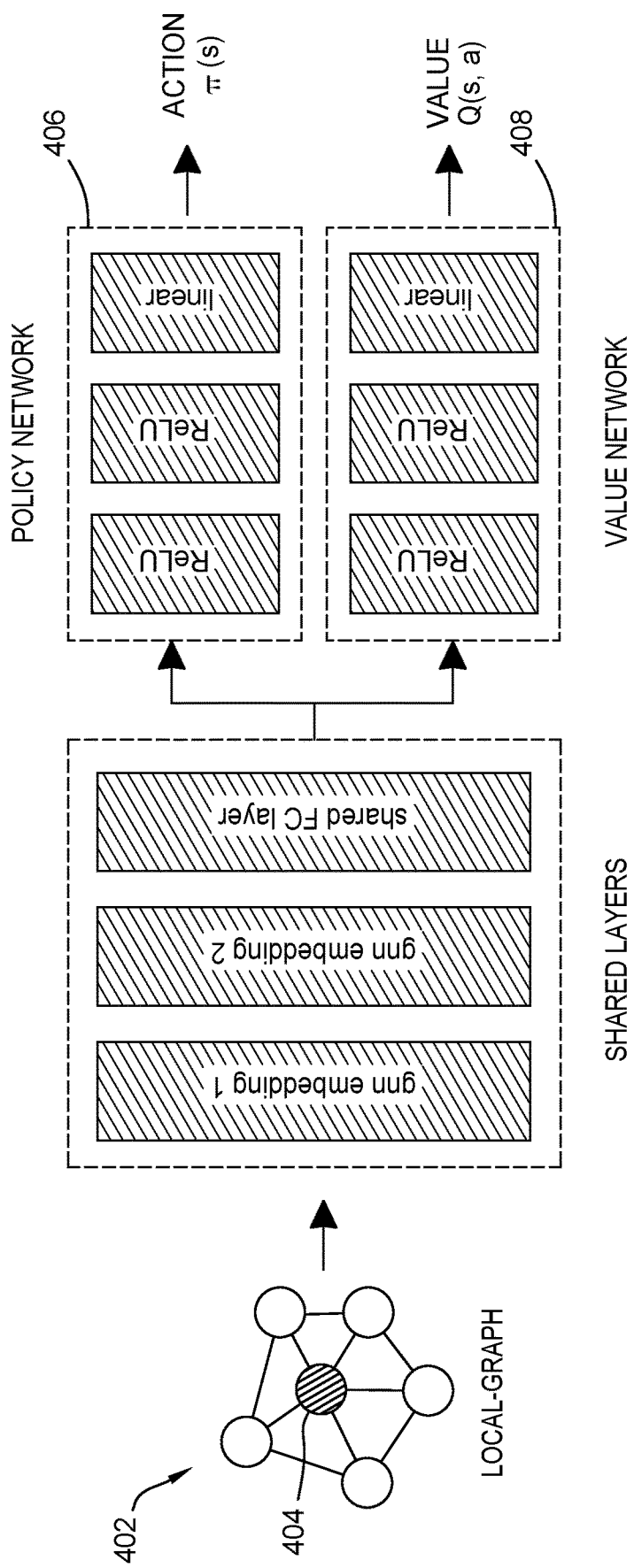
FIG. 4 illustrates an example graph encoding in the system of FIG. 1.

FIG. 4 illustrates an example graph encoding in the system of FIG. 1. As seen in FIG. 4, a local graph 402 with a center node 404 (e.g., gate d) undergoes feature encoding to capture neighborhood information. As discussed previously, the encoding may produce a state vector that is a numerical representation of the local graph 402. The encoded features are inputs to a policy network 406 and a value network 408, which may be neural networks that predict the action and value, respectively. Each of the elements and features in FIG. 4 (e.g., the local graph 402, the encoding, the policy network 406, and the value network 408) may be implemented by the RL agent (shown in FIG. 1).

TABLE 1

| features | descriptions |
| --- | --- |
| slack | worst slack of paths through instance |
| in_slew | worst input pin slew |
| out_slew | output pin slew |
| arc_delay | worst cell arc (input to output pin) delay |
| nom_delay | nominal delay (fan-out of 4) |
| cell_cap | cell capacitance |
| drv_length | driving (output) net length |
| drv_load | sum of driving capacitance (net + cell) |
| drv_res | sum of driving resistance |
| fanin_cap | average capacitance of fan-ins |
| sibling_cap | sum of capacitance of siblings |

Table 1 shows a typical example of feature set (per node) that is used for node encoding/embedding using networks such as a graph neural network (GNN). This set can be expanded to include more electrical, logical and physical features to accurately model the circuit. A user can choose their set of features and embedding technique. In some embodiments, the system can select a set of features and embedding technique for each adjustment category. The feature set may depend on the graph embedding algorithm and neural network architecture used. Examples of initial node features are listed in Table 1 above. The graph algorithm may perform feature aggregation and transformation based on user-specified number of hops. The aggregation may be mean, max, or weighted average. The transformation may be determined by weights of linear layers of a multi-layer perceptron network. The embedding technique may be based on the graph depth (hops) that the aggregation algorithm looks back or forward to aggregate the neighborhood information. In a simple case, it can be the average of the state vectors of a node and all its immediate neighbors.

As an example, the value of K for the K-hop graph can be determined by the specific system. K may be heuristically determined. For some circuits, K=3 is a good choice as it captures sufficient neighbors (and electrical context), and their impact on the adjustment and reward calculations may ensure sufficient expressivity of the embedding (e.g., embedding contained in the state vectors of two different local graphs are distinct and hence can be differentiated). In many designs, effects like timing slews and spatial correlation die down after two stages, so K may be 1 or 2 in these designs.

The corresponding RL reward (rt) may be subject to the RL action (at) taken at time step (t) as the QoR change on its local-graph. Each selected instance may belong to a unique time step and may be sized sequentially from time step t=0 to t=T (last instance). This order may be based on netlist topology or any other instance selection method as mentioned above. At each time step t, the objective of the system is to maximize the long-term return. This may be done using an actor-critic method like DDPG or deep Q-networks. Actor-critic methods have two components that learn jointly: actor and critic. In deep RL (e.g., RL powered by neural networks), actor refers to the policy network 406, which learns a parameterized policy (π(s)) that maps a state vector (s) to an action (a). Next, critic refers to the value network 408 which learns a value function (Q(s, a)) that evaluates the (discounted) reward of taking an action (a) on a state (s).

The learning update of the Q-function may be based on the Bellman equation, which suggests the Q-value (Q(s, a)) at current state (s) to be computed in a dynamic programming manner as $$Q(s_t, a_t) = \mathbb{E}\left[r_t + \gamma * \max_{a_{t+1}} Q(s_{t+1}, a_{t+1})\right],$$

where γ denotes the discount factor. The goal of the policy network 406 is to predict the action (at) subject to the state (st) that maximizes the Q-value (Q(st, at)). The idea is that the higher the Q-value (Q(s, a)) is, the better the action (a) is. The objective of the policy network 406 may be formulated as $$\max_{\theta_\pi} E\left[Q(s_t, \pi(s_t \mid \theta_\pi))\right],$$

where π(st|θπ) is the action output by the policy network 406 based on the encoded state vector st.

Both the value network 408 and the policy network 406 are trained by a technique referred to as temporal difference update, where for each network, a "target network" is maintained whose update is a trajectory different than that of the main network. By using a replay buffer (B) that contains previous design instances, adjustments, and rewards from previous trajectories (added in Line 9 of method 2), the temporal difference update is expected to help stabilize the training process. Finally, the training produces an actor (e.g., the policy network 406) that predicts the adjustments to improve design QoR. Previous design instances may be the instances that have been adjusted by the algorithm in prior iterations (or trajectories) and not selected for adjustment in the current iteration. The adjustments and rewards obtained from these instances in previous trajectories will impact the selection of adjustments for instances selected for adjustment in the current trajectory. The action list generation, reward analysis, and sizing may all be done on the sub-graphs, so the sizing adjustments are not submitted to the main graph for processing. Depending on the user policy (e.g., unless the RL episode shows a net gain) the adjustments may not submitted to the main graph and the episode may be ignored (state set back to original state).

Ideally, at each time step t of an RL trajectory, an action (at) may be performed and the reward (rt) may be calculated, so that instances in a common iteration do not influence each other. This reward calculation may need a local-graph STA update (not a whole netlist update). In some embodiments, the actor uses the policy network 406 to predict the adjustment. The inputs to this network may be the state embeddings of each instance whose adjustment is to be predicted. The network learns (e.g., according to Line 14 of method 2) and then predicts the adjustment for the instance that is expected to maximize the long-term reward.

The process for determining actions and rewards and for training the policy network 406 are shown in method 2 below. As discussed previously, method 2 may be performed after method 1 is complete. After method 2 is complete, method 1 may be performed again.

Method 2 RL-Opto training methodology.

Input: Initial Policy Network parameters $\theta_\pi$, Initial Deep Q Network
parameters $\theta_Q$, Target networks update ratio $\rho$, Netlist G =
(V, E)
Output: Policy Network parameters $\theta_\pi$; Deep Q Network parameters $\theta_Q$
1:    Initialize target networks (policy-, Deep Q-) parameters {$\phi$} as
    $\phi_\pi \leftarrow \theta_\pi$, $\phi_Q \leftarrow \theta_Q$, Replay Buffer B ← { }
2:    while Qbj Func does not converge do
3:    |     {V'} ← instance_selection(G)
4:    |     {s} ← local-graph_encoding(V')
5:    |     T ← |s| ▷ # of states (instances)
6:    |     for t = 0; t < T; t + + do ▷ Assign actions for all cells
7:    |     |     $a_t \leftarrow \pi(s_t|\theta_\pi)$
8:    |     Perform actions {a} and STA update to get rewards {r}
9:    |     Store all ($s_t$, $a_t$, $r_t$, $s_{t+1}$) pairs in the replay buffer B
10:   |     Sample a batch of T buffers {($s_t$, $a_t$, $r_t$, $s_{t+1}$)} from B
11:   |     for t = 0; t < T; t + + do ▷ Compute update targets y
12:   |     |     $y_t \leftarrow r_t + \gamma * Q_{\phi_Q}(s_{t+1}, \pi(s_{t+1}|\phi_\pi))$
13:   |     Update Deep Q Network $\nabla_{\theta_Q} \Sigma_t (Q_{\theta_Q}(s_t, a_t) - y_t)^2$
14:   |     Update Policy Network $\nabla_{\theta_\pi} \Sigma_t Q_{\theta_Q}(s_t, \pi(s_t|\theta_\pi))$
15:   |     $\phi_\pi \leftarrow \rho\phi_\pi + (1 - \rho)\theta_\pi$
16:   |     $\phi_Q \leftarrow \rho\phi_Q + (1 - \rho)\theta_Q$ ▷ Temporal difference update Method 2

Any objective function (Obj Func) may be used in Method 2, such as a design's total negative slack (TNS) or worst negative slack (WNS) for delay improvement, or a function of weighted delay, area, and power. Method 2 can terminate the RL iterations once t=T (final step chosen by user) or other methods such as the moving average of the objective function has not improved by a certain threshold.

In certain embodiments, for each selected instance, the system uses GNNs to encode its local-graph and takes the encoded features along with the technology features that represent the driving strength, capacitance, and slew constraints as the RL state (st). The corresponding RL reward (rt) is based on the RL action at taken at time step t as the TNS change on its local-graph. Each selected instance belongs to a unique time step and is sized sequentially from time step t=0 to t=T (last instance). This order is based on netlist topology. At each time step t, the objective is to maximize the long-term return $G_t$, which is denoted as $$\max_\theta G_t(\pi_\theta) = \mathbb{E}_\tau \left[ \sum_{k=0}^T \gamma^k r_{t+k} \right]$$

where $\pi$ denotes the policy function (network) parameterized by $\theta$, which takes the state (st) as input and outputs the corresponding action (at). To maximize this objective G, the system may perform gradient descent on the policy parameters $\theta$ using the DDPG loss function update.

In some embodiments, the system uses a GNN to encode local-graph features for each selected instance. Given a local-graph sG of a target instance v, for each node v' ε sG, the system first transforms the initial node features $h^0_{v'}$ into embeddings at level k=K as:

$$h^{k-1}_{N(v')} = \text{mean\_pool}(\{W_k^{agg} h_\mu^{k-1}, \forall \mu \in N(v')\}),$$

$$h^k_{v'} = \text{sigmoid}(W_k^{proj} \cdot \text{concat}[h^{k-1}_{v'}, h^{k-1}_{N(v')}]),$$

where N(v') denotes the neighbors of node v', $W^{agg}$ and $W^{proj}$ denote the aggregation and projection matrices, respectively. At the end of the transformation (level K), the system takes the mean pooling of $h^0_{v'=K}$ across every node v' ε sG to obtain the final local-graph feature vector st of the target instance v at time step t as:

$$s_t = \text{concat}[\text{mean\_pool}(\{h_{v'}^{k=K}\}), \text{tech}(v)],$$

where tech(v) denotes the technology features (from library files) of instance v in terms of driving strength, capacitance, and slew constraints. This vector st, which characterizes the local-graph and the underlying instance, is taken as the input to determine an adjustment that helps improve the design performance. The dimension of the GNN-encoded vector $h_{v'}$ may be subject to the number of neurons in the last layer of the GNN module.

Figure 5:
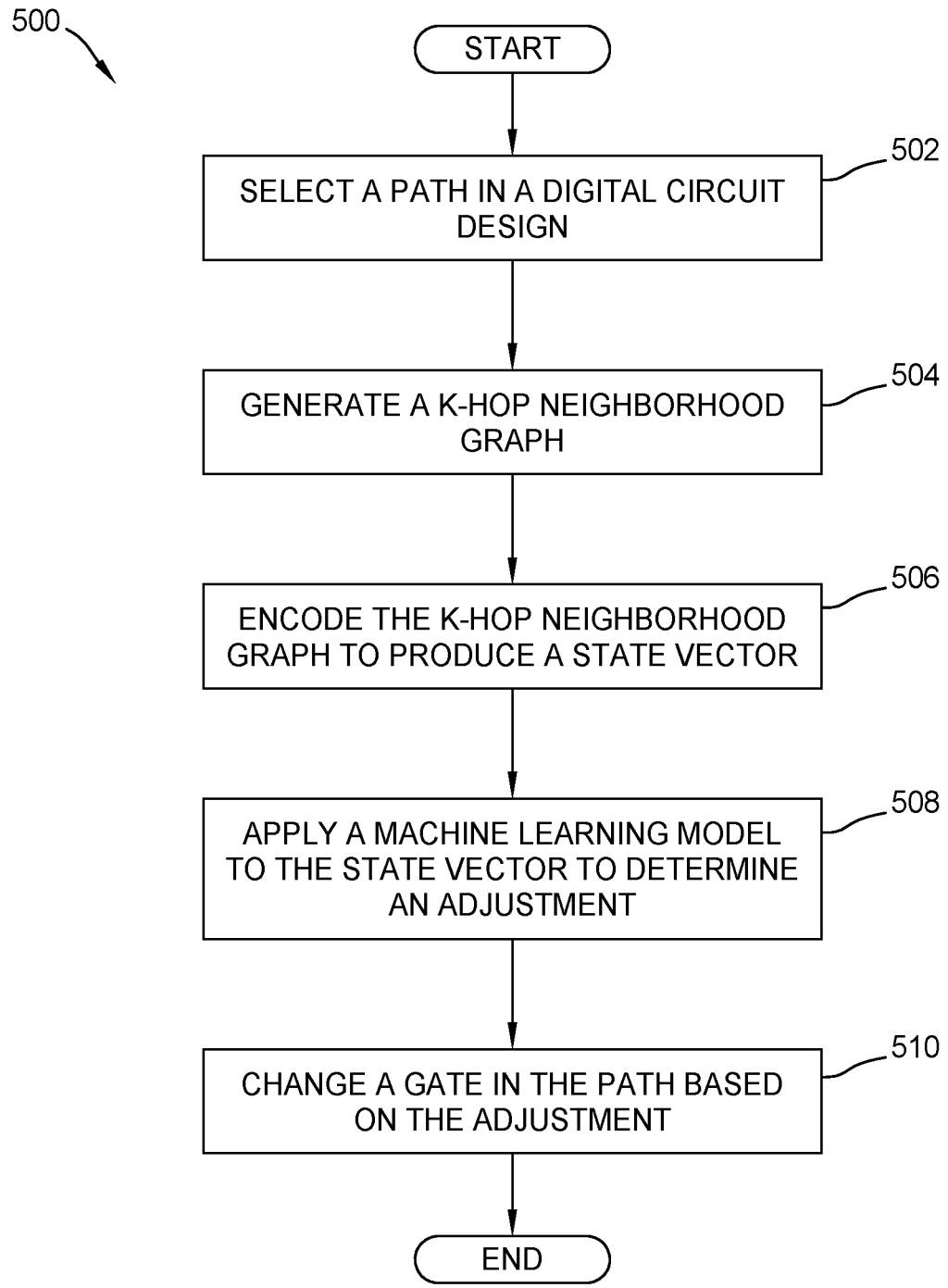
FIG. 5 is a flowchart of an example method performed in the system of FIG. 1.

FIG. 5 is a flowchart of an example method 500 performed in the system 100 of FIG. 1. In particular embodiments, the RL agent 102 performs the steps of the method 500. By performing the method 500, the RL agent 102 applies machine learning to select a set of adjustments to be made to a digital circuit design that improves the overall reward of the process, in certain embodiments.

In 502, the RL agent 102 selects a path in a digital circuit design. The path may include a plurality of logic gates. The RL agent 102 may analyze the path to determine one or more adjustments to make to one or more of the gates in the path. In 504, the RL agent 102 generates a K-hop neighborhood graph for the path. For example, the RL agent 102 may select a gate in the path and generate the graph to include the gate and its neighbors in the digital circuit design that are within K hops of the gate. In 506, the RL agent 102 encodes the K-hop neighborhood graph to produce a state vector, which is a numerical representation of the characteristics of the gate and its neighbors within K hops.

In 508, the RL agent 102 applies a machine learning model to the state vector to determine an adjustment to make to the gate. In this manner, the RL agent 102 determines an adjustment for the gate based on the characteristics of the gate and the characteristics of its neighbors within K hops. In 510, the RL agent 102 changes the gate in the path based on the adjustment. In some embodiments, the RL agent 102 communicates the adjustment to a selector 104 that applies the adjustment to the gate.

The method 500 may be performed multiple times for the gate and for the other gates in the path. Between the iterations of the method 500, the selector 504 may determine a reward for making the selected adjustments on the digital circuit design. The RL agent 102 may update the machine learning model based on the reward and selected actions. In this manner, the RL agent 102 continues to learn how to select better adjustments while increasing the reward for the digital circuit design. In some embodiments, the selector 504 also determines and instructs the RL agent 102 as to the next path or gate to analyze and adjust.

Figure 6:
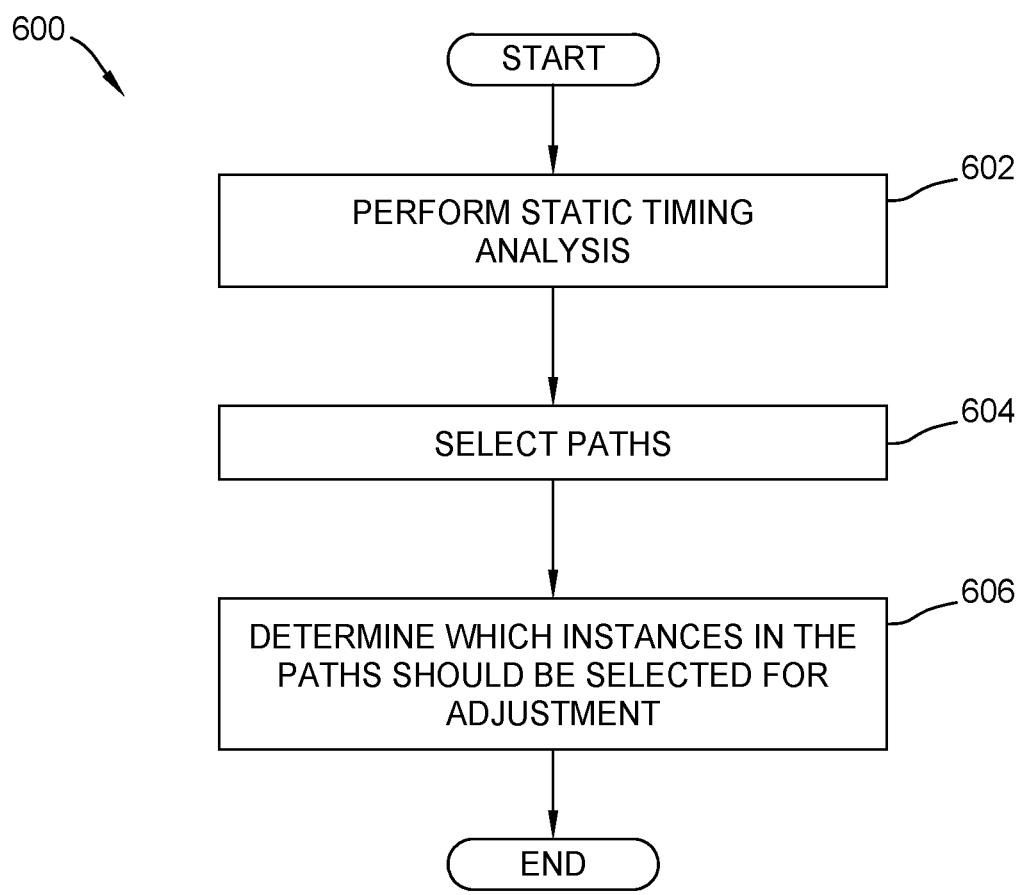
FIG. 6 is a flowchart of an example method performed in the system of FIG. 1.

FIG. 6 is a flowchart of an example method 600 for selecting instances performed in the system 100 of FIG. 1. In certain embodiments, the selector 104 performs the method 600 to select the instances to be evaluated by the RL agent 102.

In 602, the selector 604 performs STA on a digital circuit design to determine certain characteristics of various paths in the circuit design. For example, the selector 104 may determine the slack of the paths in the digital circuit design. In 604, the selector 104 selects paths in the digital circuit design based on the results of the STA. For example, the selector 104 may identify and select the paths with negative slack. The selector 104 may also identify the path with the worst negative slack.

In 606, the selector 104 determines which instances in the paths should be selected for adjustment. For example, the selector 104 may identify and select certain gates in the paths for adjustment. In some embodiments, the selector 104 analyzes each of the paths with negative slack and selects the gates in these paths for adjustment. After identifying and selecting the gates for adjustment, the selector 104 may sort the selected gates or paths. For example, the selector may perform a topological sort of the selected gates or paths. The selector 104 then passes the identified and selected gates or paths to the RL agent 102 for adjustment.

Figure 7:
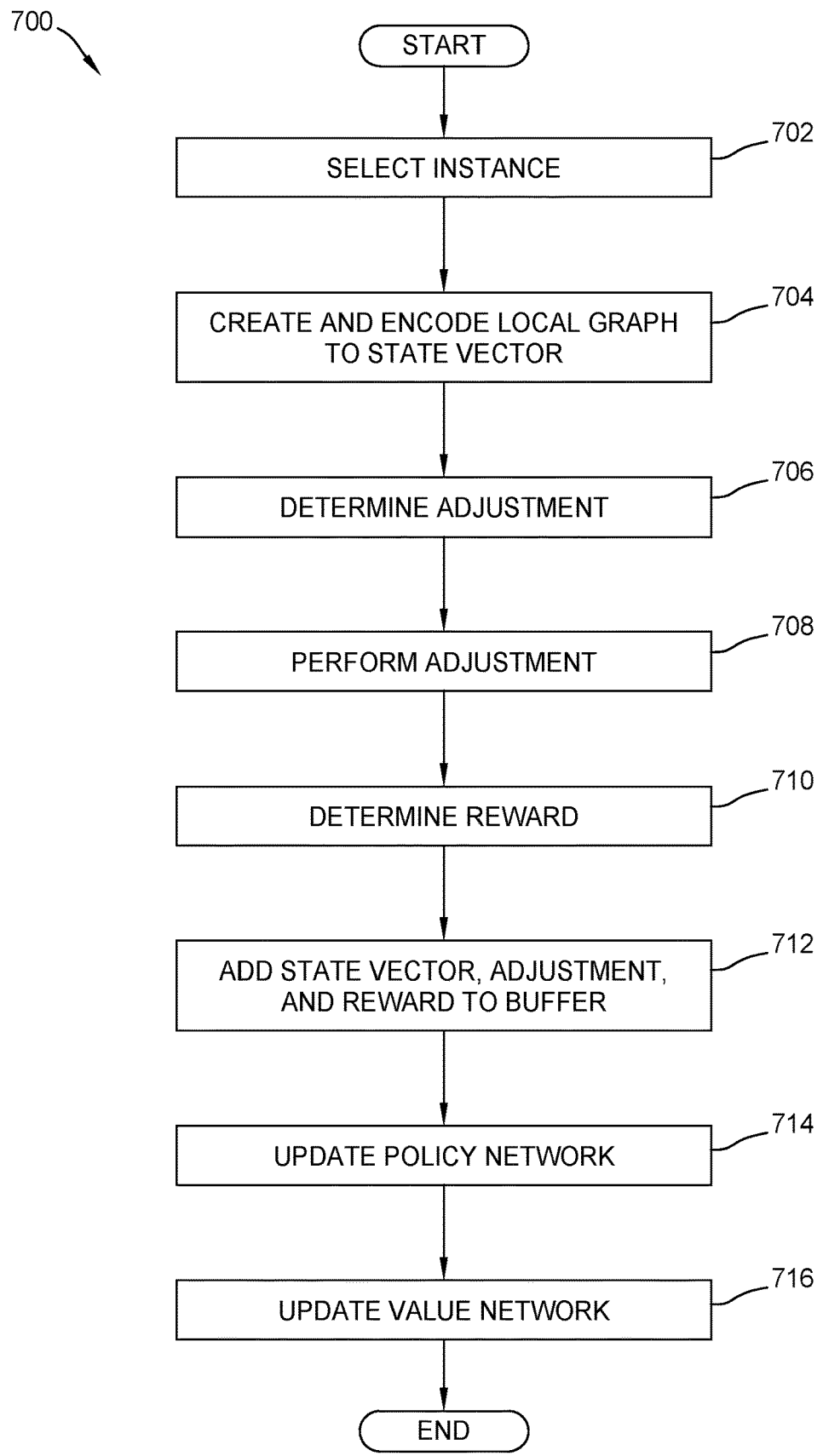
FIG. 7 is a flowchart of an example method performed in the system of FIG. 1.

FIG. 7 is a flowchart of an example method 700 performed in the system 100 of FIG. 1. In particular embodiments, the RL agent 102 and/or the selector 104 perform one or more of the steps of the method 700 to train neural networks (e.g., the policy network 406 and the value network 408).

In 702, the RL agent 102 selects an instance (e.g., a gate). For example, the selector 104 may send a set of gates to the RL agent 102, and the RL agent 102 may select a gate from the set. In 704, the RL agent 102 encodes the selected gate. For example, the RL agent 102 may create a K-hop neighborhood graph of the selected gate. The graph may include the neighbors within K hops of the selected gate. The RL agent 102 then encodes the graph to create a state vector, which includes a numerical representation of the selected gate and its neighbors.

In 706, the RL agent 102 determines an adjustment to be made to the gate. For example, the RL agent 102 may use the policy network 406 to analyze the state vector and to determine an adjustment that the policy network 406 predicts will lead improve the negative slack in the path of the circuit design. In 708, the RL agent 102 performs the adjustment to the gate.

In 710, the RL agent 102 or the selector 104 use the value network 408 to determine the reward for the adjustment. For example, the value network 408 may analyze the circuit design after the adjustment to determine the updated slack of the path. Additionally, the value network 408 may determine an expected improvement to the slack of the path based on adjustments that may be subsequently made to the circuit design. For example, the value network 408 may predict a slack value that may result from the overall adjustment process. In 712, the RL agent 102 or the selector 104 add the state vector, the adjustment, and the reward (e.g., predicted slack value(s)) to a buffer. In 714, the RL agent 102 uses the information in the buffer to update the policy network 406. In this manner, the policy network 406 is trained based on its predicted adjustment and the reward for that adjustment. As a result, the policy network 406 may be trained to make better adjustments in the future (e.g., adjustments that further improve the PPA of the circuit design). In 716, the RL agent 102 or the selector 104 update the value network 408 using the information in the buffer. In this manner, the value network 408 is trained based on the predicted adjustment and its determined reward for that adjustment. As a result, the value network 408 may be trained to more accurately predict the reward for future adjustments.

Figure 8:
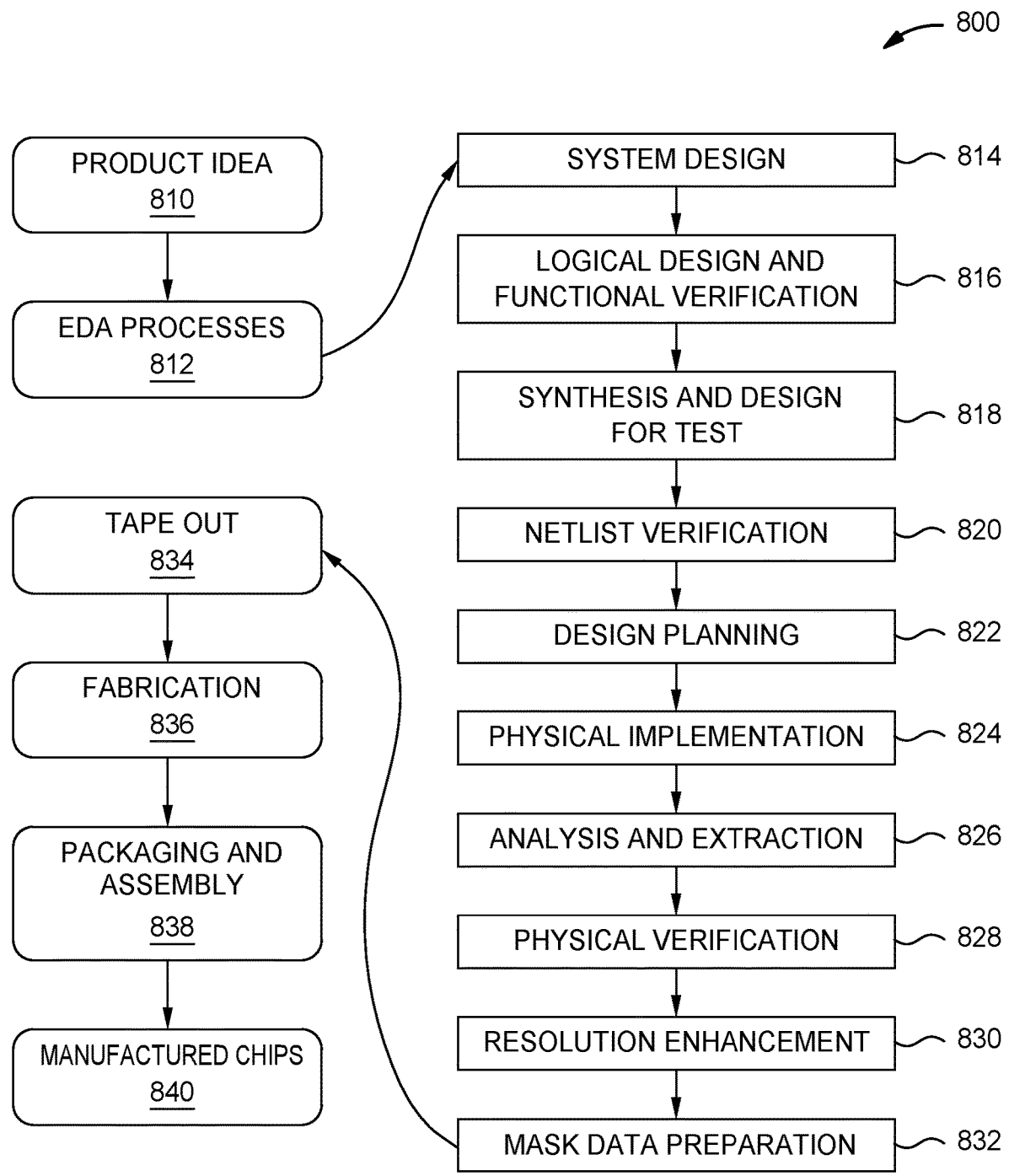
FIG. 8 depicts a flowchart of various processes used during the design and manufacture of an integrated circuit in accordance with some embodiments of the present disclosure.

FIG. 8 illustrates an example set of processes 800 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 810 with information supplied by a designer, information which is transformed to create an article of manufacture that uses a set of EDA processes 812. When the design is finalized, the design is taped-out 834, which is when artwork (e.g., geometric patterns) for the integrated circuit is sent to a fabrication facility to manufacture the mask set, which is then used to manufacture the integrated circuit. After tape-out, a semiconductor die is fabricated 836 and packaging and assembly processes 838 are performed to produce the finished integrated circuit 840.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding tools of that layer (e.g., a formal verification tool). A design process may use a sequence depicted in FIG. 8. The processes described by be enabled by EDA products (or tools).

During system design 814, functionality of an integrated circuit to be manufactured is specified. The design may be adjusted for desired characteristics such as power consumption, performance, area (physical and/or lines of code), and reduction of costs, etc. Partitioning of the design into different types of modules or components can occur at this stage.

During logic design and functional verification 816, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 818, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be adjusted for a target semiconductor manufacturing technology. Additionally, the finished integrated circuit may be tested to verify that the integrated circuit satisfies the requirements of the specification.

During netlist verification 820, the netlist is checked for compliance with timing constraints and for correspondence with the HDL code. During design planning 822, an overall floor plan for the integrated circuit is constructed and analyzed for timing and top-level routing.

During layout or physical implementation 824, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 826, the circuit function is verified at the layout level, which permits refinement of the layout design. During physical verification 828, the layout design is checked to ensure that manufacturing constraints are correct, such as DRC constraints, electrical constraints, lithographic constraints, and that circuitry function matches the HDL design specification. During resolution enhancement 830, the geometry of the layout is transformed to improve how the circuit design is manufactured.

During tape-out, data is created to be used (after lithographic enhancements are applied if appropriate) for production of lithography masks. During mask data preparation 832, the 'tape-out' data is used to produce lithography masks that are used to produce finished integrated circuits.

A storage subsystem of a computer system (such as computer system 900 of FIG. 9) may be used to store the programs and data structures that are used by some or all of the EDA products described herein, and products used for development of cells for the library and for physical and logical design that use the library.

Figure 9:
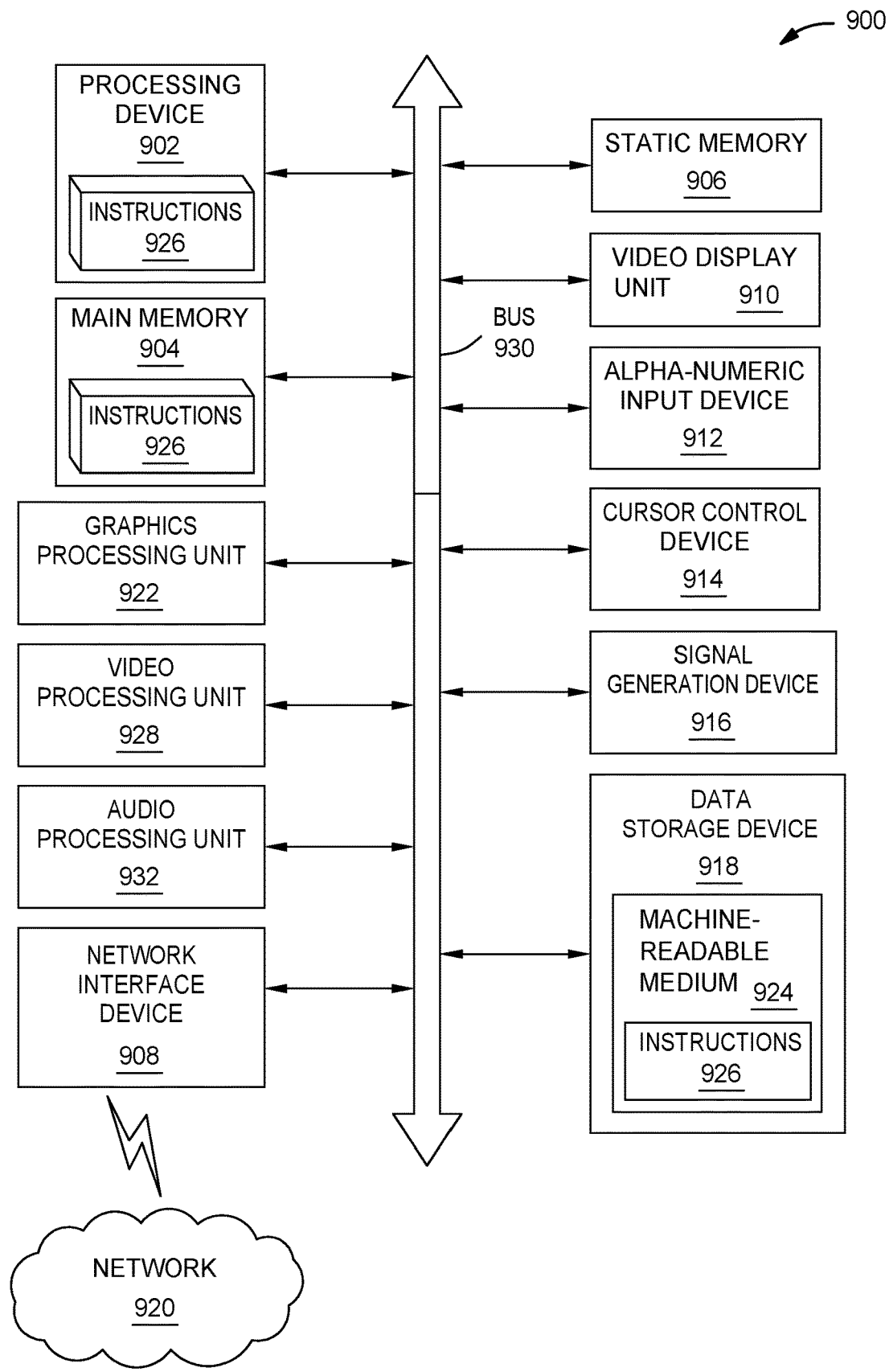
FIG. 9 depicts a diagram of an example computer system in which embodiments of the present disclosure may operate.

FIG. 9 illustrates an example machine of a computer system 900 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM), a static memory 906 (e.g., flash memory, static random access memory (SRAM), etc.), and a data storage device 918, which communicate with each other via a bus 930.

Processing device 902 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. The processing device 902 may be configured to execute instructions 926 for performing the operations and steps described herein.

The computer system 900 may further include a network interface device 908 to communicate over the network 920. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), a graphics processing unit 922, a signal generation device 916 (e.g., a speaker), graphics processing unit 922, video processing unit 928, and audio processing unit 932.

The data storage device 918 may include a machine-readable storage medium 924 (also known as a non-transitory computer-readable medium) on which is stored one or more sets of instructions 926 or software embodying any one or more of the methodologies or functions described herein. The instructions 926 may also reside, completely or at least partially, within the main memory 904 and/or within the processing device 902 during execution thereof by the computer system 900, the main memory 904 and the processing device 902 also constituting machine-readable storage media.

In some implementations, the instructions 926 include instructions to implement functionality corresponding to the present disclosure. While the machine-readable storage medium 924 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 902 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method of adjusting a digital circuit design, the method comprising:
    selecting a first path in the digital circuit design, the first path comprising a plurality of gates;
    generating a k-hop neighborhood graph of the first path, where k is a positive integer;
    encoding the k-hop neighborhood graph into a state vector;
    applying a machine learning model to the state vector to determine an adjustment to be made on a first gate of the plurality of gates; and
    changing the first gate based on the adjustment.

2. The method of claim 1, further comprising:
    performing a static timing analysis on the digital circuit design after changing the first gate; and
    updating the machine learning model based on results of the static timing analysis.

3. The method of claim 1, wherein selecting the first path comprises performing a static timing analysis to identify a plurality of paths.

4. The method of claim 3, wherein selecting the first path comprises selecting the first path from the plurality of paths based on a slack of the first path.

5. The method of claim 1, further comprising applying the machine learning model to determine a second adjustment on the first gate if an objective function of the digital circuit design does not converge.

6. The method of claim 1, further comprising applying the machine learning model to determine a second adjustment on a second gate of a second path in the digital circuit design after changing the first gate.

7. The method of claim 1, wherein the adjustment is to one or more of gate sizing, buffering, logic restructuring, sequencing, clock-tree skewing, placement, and routing.

8. An apparatus for adjusting a digital circuit design, the apparatus comprising:
a memory; and
a hardware processor communicatively coupled to the memory, the hardware processor configured to:
generate a k-hop neighborhood graph for a first gate in the digital circuit design, wherein the k-hop neighborhood graph comprises a plurality of nodes representing a plurality of neighbors of the first gate in the digital circuit design;
encode the k-hop neighborhood graph into a state vector comprising a numerical representation of the first gate and the plurality of neighbors;
apply a machine learning model to the state vector to determine, based on a graph neural network, an adjustment to be made to the first gate; and
change the first gate based on the adjustment.

9. The apparatus of claim 8, wherein the hardware processor is further configured to:
perform a static timing analysis on the digital circuit design after changing the first gate; and
update the machine learning model based on results of the static timing analysis.

10. The apparatus of claim 8, wherein the hardware processor is further configured to select a path comprising the first gate by performing a static timing analysis to identify the path.

11. The apparatus of claim 10, wherein selecting the path comprises selecting the path from a plurality of paths based on a slack of the path.

12. The apparatus of claim 8, wherein the hardware processor is further configured to apply the machine learning model to determine a second adjustment on the first gate if an objective function of the digital circuit design does not converge.

13. The apparatus of claim 8, wherein the hardware processor is further configured to apply the machine learning model to determine a second adjustment on a second gate in the digital circuit design after changing the first gate.

14. The apparatus of claim 8, wherein the adjustment is to one or more of gate sizing, buffering, logic restructuring, sequencing, clock-tree skewing, placement, and routing.

15. A non-transitory computer readable medium storing instructions that, when executed by a processor, cause the processor to perform an operation for adjusting a digital circuit design, the operation comprising:
generating a plurality of k-hop neighborhood graphs for a plurality of gates in the digital circuit design;
encoding the plurality of k-hop neighborhood graphs into a plurality of state vectors;
applying a machine learning model to the plurality of state vectors to determine a plurality of adjustments to be made to the plurality of gates that improve a power, performance, and area (PPA) of the digital circuit design even though an adjustment of the plurality of adjustments worsens the PPA of the digital circuit design; and
changing the plurality of gates based on the plurality of adjustments.

16. The non-transitory computer readable medium of claim 15, wherein the operation further comprises:
performing a static timing analysis on the digital circuit design after changing the plurality of gates; and
updating the machine learning model based on results of the static timing analysis.

17. The non-transitory computer readable medium of claim 15, wherein the operation further comprises selecting a path comprising the plurality of gates by performing a static timing analysis to identify the path.

18. The non-transitory computer readable medium of claim 17, wherein selecting the path comprises selecting the path from a plurality of paths based on a slack of the path.

19. The non-transitory computer readable medium of claim 15, wherein the operation further comprises applying the machine learning model to determine an adjustment on a gate of the plurality of gates if an objective function of the digital circuit design does not converge.

20. The non-transitory computer readable medium of claim 15, wherein the operation further comprises applying the machine learning model to determine a second adjustment on a second gate in the digital circuit design after changing a first gate of the plurality of gates.

* * * * *